United States Patent
Zhang et al.

(10) Patent No.: US 10,153,723 B2
(45) Date of Patent: Dec. 11, 2018

(54) SOLAR THERMAL ENERGY—FIELD ELECTRON EMISSION POWER GENERATION DEVICE

(71) Applicants: Xun Zhang, Shandong (CN); Guoji Zhang, Beijing (CN)

(72) Inventors: Xun Zhang, Shandong (CN); Guoji Zhang, Beijing (CN)

(*) Notice: Subject to any disclaimer, the term of this patent is extended or adjusted under 35 U.S.C. 154(b) by 185 days.

(21) Appl. No.: 15/121,031

(22) PCT Filed: Mar. 7, 2016

(86) PCT No.: PCT/CN2016/000108
§ 371 (c)(1),
(2) Date: Aug. 23, 2016

(87) PCT Pub. No.: WO2016/180031
PCT Pub. Date: Nov. 17, 2016

(65) Prior Publication Data
US 2018/0048258 A1   Feb. 15, 2018

(30) Foreign Application Priority Data

May 11, 2015   (CN) .......................... 2015 1 0250949

(51) Int. Cl.
*H02S 10/30* (2014.01)
*H01L 31/054* (2014.01)
*H02S 40/22* (2014.01)
*H01L 35/00* (2006.01)

(52) U.S. Cl.
CPC .......... *H02S 10/30* (2014.12); *H01L 31/0543* (2014.12); *H01L 35/00* (2013.01); *H02S 40/22* (2014.12); *Y02E 10/40* (2013.01)

(58) Field of Classification Search
CPC ..... H02S 10/30; H02S 44/22; H01L 31/0543; H01J 45/00
See application file for complete search history.

(56) References Cited

U.S. PATENT DOCUMENTS

2002/0157701 A1* 10/2002 Akamatsu ............... H01J 45/00
136/246

* cited by examiner

*Primary Examiner* — Matthew T Martin

(57) ABSTRACT

The present invention relates to a solar thermal energy-field electron emission power generation device, which is formed by a solar cooker and a heat-field electron emission power generation body. Based on the metal heat-field electron emission experiment, magnetic focusing and magnetic insulation are adopted to form the power generation device, which has characteristics of environmental protection, low cost and high efficiency. Therefore, the power generation device of the present invention can be widely applied to companies and individuals without common electric circuits, such as graze, sentry post, forest protection, cultivation of high seas, and marine power.

12 Claims, 3 Drawing Sheets

SOLAR THERMAL ENERGY—FIELD ELECTRON EMISSION POWER GENERATION DEVICE

CROSS REFERENCE OF RELATED APPLICATION

This is a U.S. National Stage under 35 U.S.C 371 of the International Application PCT/CN2016/000108, filed Mar. 7, 2016, which claims priority under 35 U.S.C. 119(a-d) to CN 201510250949.1, filed May 11, 2015.

BACKGROUND OF THE PRESENT INVENTION

Field of Invention

The present invention relates to a solar thermal energy-field electron emission power generation device, and more particularly to a solar thermal energy-field electron emission power generation device which utilizes magnetic insulation as the main technical feature.

Description of Related Arts

In the world, fossil fuels such as coal, oil and natural gas, are becoming increasingly depleted. With the decrease of producing area reserves, the world faces violent fluctuations in energy prices, which impacts on global economic development. It is necessary to look for some energy which not only have long-term adequate supplies, but also don't cause environmental pollution, thereby easing energy pressures.

Solar energy is not only the primary energy, but the renewable energy. It is rich in resources and has no environmental pollution. Due to safety and reliability, no pollution, short construction period and simple maintenance, the solar photovoltaic generation is widely used.

SUMMARY OF THE PRESENT INVENTION

To change energy shortage situations, existing magnetic focusing, magnetic insulation, metal heat-field electron emission experiments and other studies on technical characteristics have already very matured. The magnetic insulation phenomenon means that apply the externally magnetic field or use the own magnetic field of conduction current, to effectively deflect the electron trajectory after electron emission, that is to say, the electrons from the cathode are unable to reach the anode, no penetrating current channel is formed between the cathode and the anode, thereby ensuring the physical process of vacuum insulation effectiveness. Magnetically insulated transmission line (MITL) has been widely applied to the flash camera device. The present invention particularly proposes a solar energy power generation technical scheme which utilizes the metal heat-field electron emission experiment as the basic structure. In the experimental structure, instead of electrical heating of the heat metal, the solar cooker is used to reflect for focusing sunlight, and then the sunlight is focused again through the convex lens to heat up the heat metal. In the experimental structure, the magnetic lens is added to magnetically focus the emission electrons. In the experimental structure, the magnetic field is added for deflecting the emission electrons to unable to reach the anode, so as to form the magnetic insulation. In the experimental structure, the collector is added to collect the deflected electrons, for accumulating the emission electrons on the collector, and the collector is connected with connecting wires, so as to provide the electric power for the solar thermal energy-field electron emission power generation device. The grid component is added to reduce the influence of the space-charge effect, and increase the intensity of the cathode emission electrons. The solar thermal energy-field electron emission power generation device, provided by the present invention, utilizes magnetic focusing and magnetic insulation as the main technical features.

Under normal temperature, in spite of continuously thermally moving, free electrons in the metal are still unable to break loose from the surface of the metal. Only when the additional energy is applied can the free electrons be released from an object, which is called as excitation. Based on different excitation modes, the electronic emission is divided into thermionic emission, photoelectric emission and secondary electron emission. The emission, which is produced under the effect of strong electric field, is called as field electron emission. The phenomenon, that the emitted electron beams are focused at one point under the effect of the magnetic field, is called as magnetic focusing.

The magnetic insulation technology of the MITL has been widely applied to the power transmission line. It is same with the common vacuum transmission line, after loading the impulse power on the MITL, electric charges are produced on the polar plate of the transmission line, the electrically magnetic field is built between electrodes; instead of moving along the direction of electrical field (namely, the radius), electrons between the electrodes are deflected along the axial direction. The reason is that the magnetic force is also applied to the electrons, and the direction of the magnetic force is always perpendicular to the moving direction of the electrons, so that the electrons are emitted from the cathode and are unable to move towards the anode, thereby forming the magnetic insulation.

Beneficial effects of the present invention are as follows. Based on the metal heat-field electron emission experiment, the solar energy, magnetic focusing and magnetic insulation are adopted to form the power generation device, which has characteristics of environmental protection, low cost and high efficiency. Therefore, the power generation device of the present invention can be widely applied to companies and individuals without common electric circuits, such as graze, sentry post, forest protection, cultivation of high seas, and marine power.

BRIEF DESCRIPTION OF THE DRAWINGS

The present invention is further explained with accompanying drawings as follows.

In FIG. 1, 1: collector; 2: anode; 5: heat metal; 6: convex lens; 7: magnetic lens; 41: electron beam; 42: magnetic field; 43: sunlight.

In FIG. 2, 1: collector; 2: anode component; 3: magnet; 4: ceramic case; 5: heat metal component; 6: convex lens; 7: magnetic lens; 8: cooling liquid outlet; 9: cooling liquid inlet; 10: cooling liquid chamber; 11: first heat metal connecting line; 12: second heat metal connecting line; 13: anode connecting line; 14: collector connecting line.

In FIG. 3, 101: collector copper circular ring column; 102: ceramic layer; 14: collector connecting line.

In FIG. 4, 11: first heat metal connecting line; 12: second heat metal connecting line; 15: heat metal disc.

In FIG. 5, 13: anode connecting line; 16: anode metal.

In FIG. 6, 3: magnet.

In FIG. 7, 20: solar cooker; 30: first support; 40: solar thermal energy-field electron emission power generation body; 50: second support.

DETAILED DESCRIPTION OF THE PREFERRED EMBODIMENT

Figure 1:
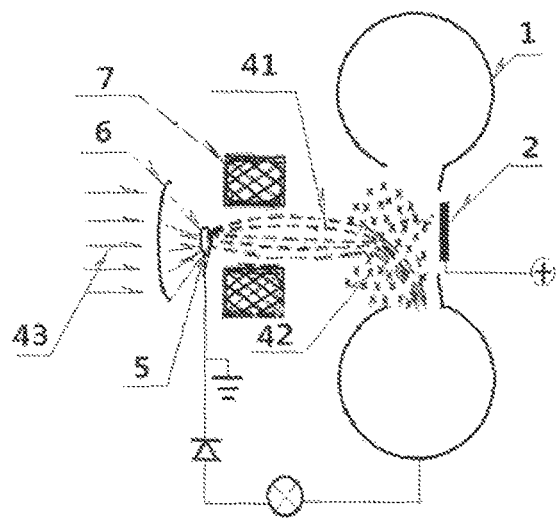
FIG. 1 is a basic principle chart of a solar thermal energy-field electron emission power generation body.

Referring to FIG. 1, in a vacuum environment, a voltage is applied between a heat metal component 5 and an anode component 2; when sunlight 43 is focused by a solar cooker, and then focused to the heat metal component 5 through a convex lens 6, a basic structure of solar energy metal heat-field electron emission is formed. When the heat metal component 5 is heated up to a certain temperature through sunlight, electrons are drawn by a positive electric field of the anode component 2 to flow towards the anode component 2. A magnetic lens 7, located between the heat metal component 5 and the anode component 2, focuses the electrons. The electrons are restrained by a magnetic field of the magnetic lens 7 to flow towards the anode component 2. The electrons are deflected under an effect of an external magnetic field 42 to unable to reach the anode component 2 for forming magnetic insulation. An effect of the magnetic insulation is that an electrical supply equipment for the anode component 2 has very small energy losses, and the electrons are deflected to reach a collector 1 for being applied to electrical equipments through connecting terminals. Therefore, the magnetic insulation is a key technology of the present invention. A diode is adapted for avoiding electronic reverse flow. The above description is a principle of solar thermal energy-field electron emission power generation, and particularly, a basic principle of a solar thermal energy-field electron emission power generation device which utilizes the magnetic insulation as the main technical feature.

Figure 2:
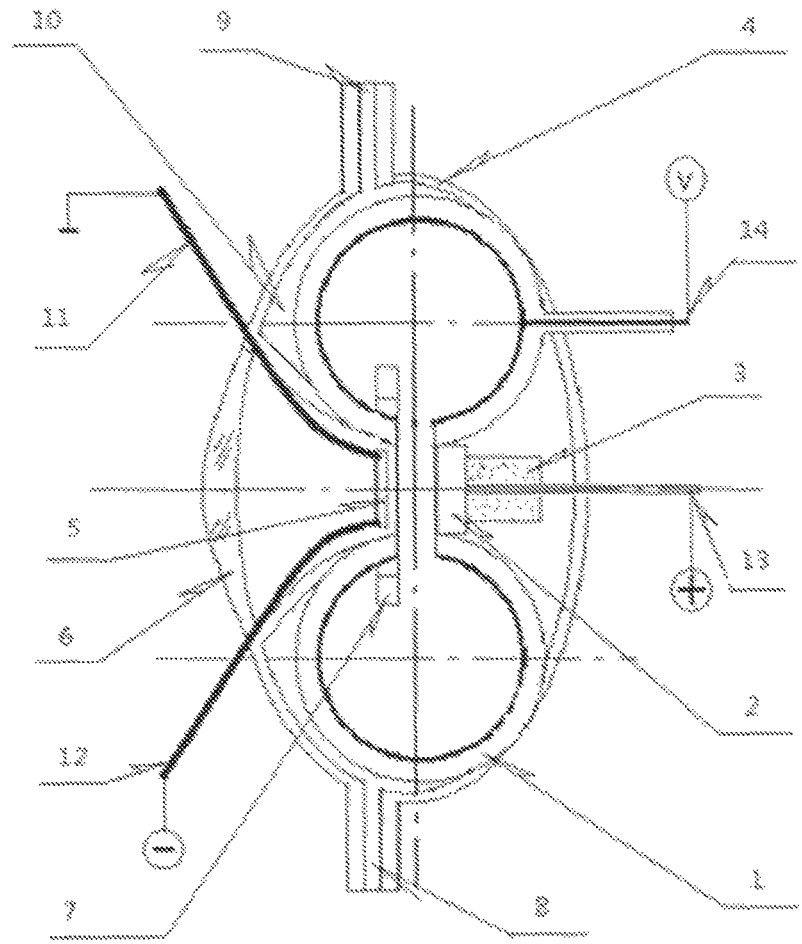
FIG. 2 is a schematic view of the solar thermal energy-field electron emission power generation body.

FIG. 2 is a schematic view of a solar thermal energy-field electron emission power generation body. Based on FIG. 1, a ceramic case 4, made of temperature resistant ceramic materials, is added. The ceramic case 4, a convex lens 6, a collector 1 and an anode component 2 form a vacuum chamber and a cooling liquid chamber 10, a cooling liquid flows into a cooling liquid inlet 9 and flows out from a cooling liquid outlet 8. A ceramic layer is coated on an external surface of the collector 1 which is made of oxygen-free copper, for insulating the collector 1 from an exterior. A heat metal component 5, the collector 1, the anode component 2, and a magnet 3 are assembled by taking an optical axis of the convex lens 6 as a center, to be fixed to the ceramic case 4 for forming the solar thermal energy-field electron emission power generation body. A negative voltage is applied to a heat meal component 5 through a heat metal connecting line 12, and a positive voltage is applied to the anode component 2 through an anode connecting line 13, so as to form an electric field environment of heat-field electron emission. When the convex lens 6 focuses sunlight to heat up the heat metal component 5, once a temperature reaches a certain temperature, a heat-field electron emission condition is formed. Electrons leap from a heat metal surface of the heat metal component 5, and then are focused by a magnetic lens 7 to flow towards the anode component 2. The magnetic lens 7 is installed within an inner chamber of the collector 1. Before reaching the anode component 2, the electrons are deflected under an effect of a magnetic field of the magnet 3 to produce a magnetic insulation effect. Due to the magnetic insulation, the electrons are driven to the collector 1 and then led to electrical equipments by a collector connecting line 14.

Figure 3:
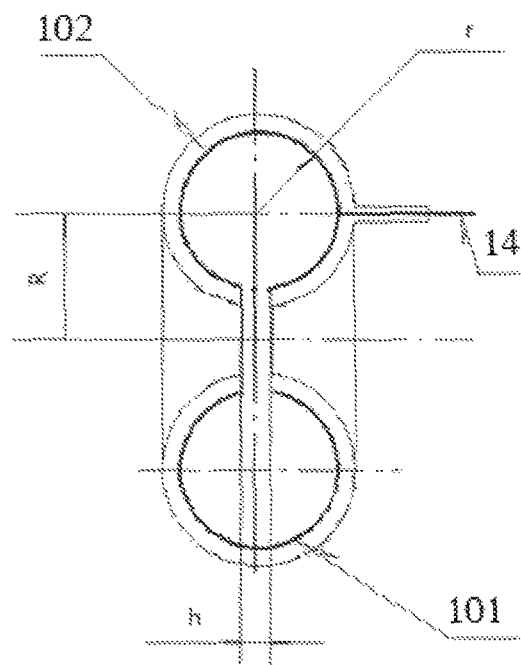
FIG. 3 is a schematic view of a collector of the solar thermal energy-field electron emission power generation body.

FIG. 3 is a schematic view of a collector of the solar thermal energy-field electron emission power generation body. The collector is a copper circular ring column 101 which is made of red copper and has a circular cylindrical shape with a cylinder radius r and an inner radius R. A ceramic layer 102 is coated on an external surface of the copper circular ring column 101. An annular groove with a width of h is provided at an inner edge of the copper circular ring column. A collector connecting line 14 is connected with the copper circular ring column.

Figure 4:
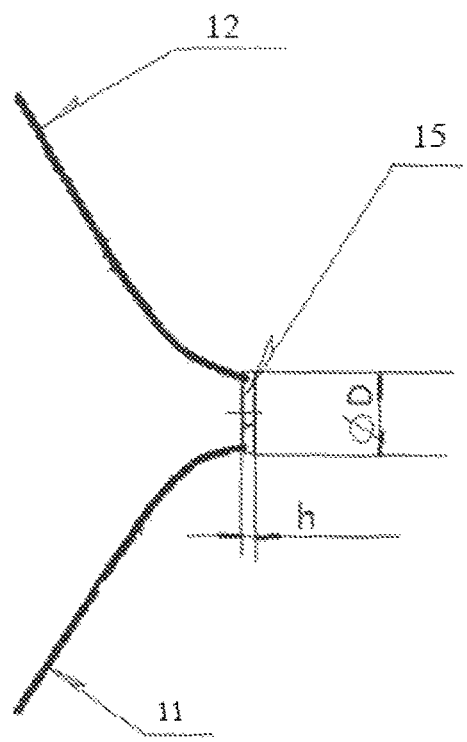
FIG. 4 is a schematic view of a heat metal component of the solar thermal energy-field electron emission power generation body.

FIG. 4 is a schematic view of a heat metal component of the solar thermal energy-field electron emission power generation body. The heat metal component is formed by connecting a first heat metal connecting line 11 and a second heat metal connecting line 12 to a disk with a diameter of D and a thickness of h which is made of heat metal materials.

Figure 5:
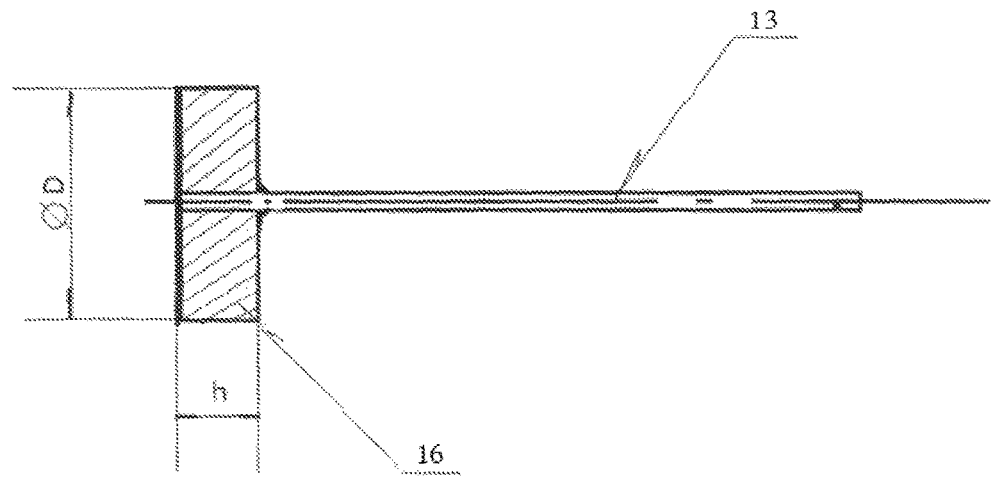
FIG. 5 is a schematic view of an anode component of the solar thermal energy-field electron emission power generation body.

FIG. 5 is a schematic view of an anode component of the solar thermal energy-field electron emission power generation body. An anode metal 16 is formed by a copper disc with a hole at a center thereof, and the copper disc has a diameter of D and a thickness of h. An anode connecting line 13 is a capillary made of copper and is welded to the central hole of the anode metal 16.

Figure 6:
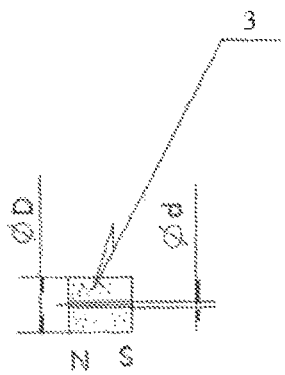
FIG. 6 is a schematic view of a magnet of the solar thermal energy-field electron emission power generation body.

FIG. 6 is a schematic view of a magnet of the solar thermal energy-field electron emission power generation body. The magnet 3 is a cylindrical magnet with a hole at a center thereof. The magnet 3 has an external diameter of D and an internal diameter of d. The magnet is sleeved on the anode connecting line 13 of the anode component through the hole.

Figure 7:
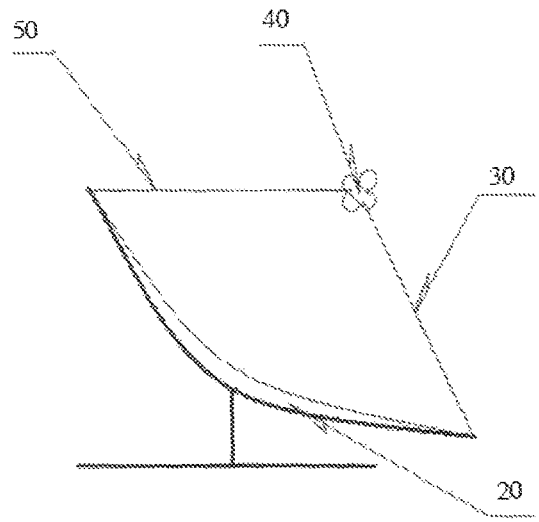
FIG. 7 is a schematic view of a magnet of the solar thermal energy-field electron emission power generation device.

FIG. 7 is a schematic view of the solar thermal energy-field electron emission power generation device. In FIG. 7, the solar thermal energy-field electron emission power generation body 40 is mounted to both a first support 30 and a second support 50 of a solar cooker 20, the convex lens is aligned with a focal point of the solar cooker, thereby forming the solar thermal energy-field electron emission power generation device.

It needs to be particularly explained that: the present invention is a scheme invention. Therefore, this invention includes all modifications encompassed within the spirit and scope of the following claims, such as an energized coil is adopted instead of the magnetic lens, the cooling chamber is removed, and the special-shaped magnet is remodeled.

What is claimed is:

1. A solar thermal energy-field electron emission power generation device, comprising: a solar concentrating device and a solar thermal energy-field electron emission power generation body mounted on the solar concentrating device, wherein:

the solar thermal energy-field electron emission power generation body comprises a convex lens, a heat metal component, a magnetic lens, a collector, an anode component, a magnet, and a ceramic case, wherein:
- each of the convex, the heat metal component, the magnetic lens, the collector, the anode component, the magnet and the ceramic case is located centrally symmetrically relatively to an optical axis of the convex lens;
- all of the convex lens, the heat metal component, the collector, the anode component and the magnet are installed to the ceramic case;
- the magnetic lens is located within the collector;
- the convex lens, the collector, the anode component and the ceramic case form a vacuum chamber and a cooling liquid chamber independently from the vacuum chamber, wherein the cooling liquid chamber has a cooling liquid inlet for allowing a cooling liquid to flow into the cooling liquid chamber, and a cooling liquid outlet for allowing the cooling liquid to flow out of the cooling liquid chamber;
- a negative voltage is applied to the heat metal component and a positive voltage is applied to the anode component, so as to provide an electric field environment for heat-field electron emission;
- an insulation layer is coated on an external surface of the collector, the anode component and the collector are insulated from each other;
- the convex lens of the solar thermal energy-field electron emission power generation body is aligned with a focal point of the solar concentrating device,
- thereby when sunlight is focused through the solar concentrating device, and then focused again through the convex lens to heat up the heat metal component to a temperature, and at this time, a condition of the heat-field electron emission is formed; electrons leap from a heat metal surface of the heat metal component, and then are focused by the magnetic lens to flow towards the anode component; before reaching the anode component, the electrons are deflected under an action of a magnetic field of the magnet to produce a magnetic insulation effect; due to the magnetic insulation effect, the electrons are driven to the collector, so as to generate electricity for electrical appliances which are connected with the collector.

2. The solar thermal energy-field electron emission power generation device, as recited in claim 1, wherein the collector of the solar thermal energy-field electron emission power generation body is a circular ring column which is made from copper; an annular groove is provided at an inner edge of the circular ring column.

3. The solar thermal energy-field electron emission power generation device, as recited in claim 1, wherein the heat metal component comprises a heat metal disk and two heat metal connecting lines connected with the heat metal disk.

4. The solar thermal energy-field electron emission power generation device, as recited in claim 2, wherein the heat metal component comprises a heat metal disk and two heat metal connecting lines connected with the heat metal disk.

5. The solar thermal energy-field electron emission power generation device, as recited in claim 1, wherein the anode component comprises:
- a copper disc having a through-hole at a center thereof; and
- an anode connecting line which is a capillary made from copper and is welded to the through-hole.

6. The solar thermal energy-field electron emission power generation device, as recited in claim 2, wherein the anode component comprises:
- a copper disc having a through-hole at a center thereof; and
- an anode connecting line which is a capillary made from copper and is welded to the through-hole.

7. The solar thermal energy-field electron emission power generation device, as recited in claim 3, wherein the anode component comprises:
- a copper disc having a through-hole at a center thereof; and
- an anode connecting line which is a capillary made from copper and is welded to the through-hole.

8. The solar thermal energy-field electron emission power generation device, as recited in claim 4, wherein the anode component comprises:
- a copper disc having a through-hole at a center thereof; and
- an anode connecting line which is a capillary made from copper and is welded to the through-hole.

9. The solar thermal energy-field electron emission power generation device, as recited in claim 5, wherein the magnet is a cylindrical magnet with a hole at a center thereof; the magnet is sleeved to the anode connecting line of the anode component through the hole of the magnet, and an N-pole of the magnet points to the anode component.

10. The solar thermal energy-field electron emission power generation device, as recited in claim 6, wherein the magnet is a cylindrical magnet with a hole at a center thereof; the magnet is sleeved to the anode connecting line of the anode component through the hole of the magnet, and an N-pole of the magnet points to the anode component.

11. The solar thermal energy-field electron emission power generation device, as recited in claim 7, wherein the magnet is a cylindrical magnet with a hole at a center thereof; the magnet is sleeved to the anode connecting line of the anode component through the hole of the magnet, and an N-pole of the magnet points to the anode component.

12. The solar thermal energy-field electron emission power generation device, as recited in claim 8, wherein the magnet is a cylindrical magnet with a hole at a center thereof; the magnet is sleeved to the anode connecting line of the anode component through the hole of the magnet, and an N-pole of the magnet points to the anode component.

* * * * *